(12) United States Patent
Haines

(10) Patent No.: US 7,833,838 B2
(45) Date of Patent: Nov. 16, 2010

(54) METHOD AND APPARATUS FOR INCREASING THE IMMUNITY OF NEW GENERATION MICROPROCESSORS FROM ESD EVENTS

(75) Inventor: Michael D. Haines, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 269 days.

(21) Appl. No.: 11/390,577

(22) Filed: Mar. 27, 2006

(65) Prior Publication Data

US 2006/0180901 A1    Aug. 17, 2006

Related U.S. Application Data

(62) Division of application No. 10/024,724, filed on Dec. 21, 2001, now Pat. No. 7,030,482.

(51) Int. Cl.
*H01L 21/44* (2006.01)
*H01L 21/48* (2006.01)
*H01L 21/50* (2006.01)

(52) U.S. Cl. ............... 438/122; 438/125; 257/E23.101
(58) Field of Classification Search ............... 257/704, 257/706, E23.101; 438/119, 122, 125
See application file for complete search history.

(56) References Cited

U.S. PATENT DOCUMENTS

| | | | |
|---|---|---|---|
| 4,559,164 A | 12/1985 | Kostelnik et al. | |
| 4,865,716 A | 9/1989 | Sibbald et al. | |
| 4,906,494 A | 3/1990 | Babinec et al. | |
| 4,985,296 A | 1/1991 | Mortimer, Jr. | |
| 5,004,561 A | 4/1991 | Nomura et al. | |
| 5,213,882 A | 5/1993 | Sassa et al. | |
| 5,229,200 A * | 7/1993 | Sassa et al. | 442/57 |
| 5,262,234 A * | 11/1993 | Minor et al. | 428/372 |
| 5,324,579 A * | 6/1994 | Sassa et al. | 442/324 |
| 5,524,908 A | 6/1996 | Reis | |
| 5,527,569 A * | 6/1996 | Hobson et al. | 428/35.2 |
| 5,554,236 A | 9/1996 | Singles et al. | |
| 5,838,542 A | 11/1998 | Nelson et al. | |
| 5,964,465 A | 10/1999 | Mills et al. | |
| 6,008,988 A | 12/1999 | Palmer | |
| 6,061,235 A * | 5/2000 | Cromwell et al. | 361/690 |

(Continued)

OTHER PUBLICATIONS

*Gore-Shield EMI Gaskets GS500 General Specifications*, Jan. 1998.

(Continued)

*Primary Examiner*—Hoai V Pham
(74) *Attorney, Agent, or Firm*—Kenyon & Kenyon LLP

(57) ABSTRACT

A method and apparatus for increasing the immunity of new generation microprocessors from electrostatic discharge events involve shielding the microprocessors at the die level. A gasket of a lossy material is provided on the substrate upon which the microprocessor is mounted. The gasket surrounds the microprocessor to protect it from electrostatic discharge pulses. A heat spreader is arranged in heat conducting relation with the microprocessor and atop at least a portion of the gasket adjacent the die. The material is a static dissipative material having a volume resistivity of greater than $10^2$ ohm cm and a shielding effectiveness to protect the microprocessor from at least 4 kV of electrostatic discharge pulse at the computer system level in which the microprocessor is to be used.

10 Claims, 2 Drawing Sheets

U.S. PATENT DOCUMENTS

| | | | |
|---|---|---|---|
| 6,080,930 | A | 6/2000 | Lommen et al. |
| 6,101,083 | A | 8/2000 | Artz et al. |
| 6,248,262 | B1 | 6/2001 | Kubotera et al. |
| 6,281,433 | B1 | 8/2001 | Decker et al. |
| 6,307,258 | B1 | 10/2001 | Crane, Jr. et al. |
| 6,390,475 | B1 | 5/2002 | Eckblad et al. |
| 6,577,504 | B1 * | 6/2003 | Lofland et al. .............. 361/709 |
| 6,932,187 | B2 * | 8/2005 | Banter et al. ................ 181/149 |

OTHER PUBLICATIONS

ESD Systems.com, *ESD Discharge Times*, Jan. 1998.

*Gore-Shield GS500 Die-Cut EMI Gaskets*, Jan. 1998.

Gore Electronic Products, *Electromagnetic Material Characterization*, Jun. 2001.

Gore Electronic Products, *Designer Face Growing EMI Shielding Problems*, Aug. 2001.

Gore Electronic Products, *Correlation of DC Resistance to EMI Shielding*, May 2001.

Gore Electronic Products, *Basic EMI Principles and Glossary*, May 2001.

Gore Electronic Products, *EMI Gaskets*, May 2001.

Static Control Components, Inc., *Basics of Static Electricity*, ByteMark Corp. 1999.

* cited by examiner

METHOD AND APPARATUS FOR INCREASING THE IMMUNITY OF NEW GENERATION MICROPROCESSORS FROM ESD EVENTS

RELATED APPLICATION

This application is a Divisional application of patent application Ser. No. 10/024,724, filed on Dec. 21, 2001 now U.S. Pat. No. 7,030,482.

TECHNICAL FIELD

The present invention relates to the field of microprocessor-based computer systems. More specifically, the present invention relates to the packaging of high performance microprocessors on substrates, including the provision of heat sinks as well as electrostatic discharge (ESD) shielding.

BACKGROUND

Historically, as reported in Assignee's U.S. Pat. No. 5,838, 542, when microprocessors were first commercialized, each microprocessor held less than one million transistors, and operated at speeds below 20 MHz. Typically, the microprocessors were either solder mounted onto the motherboards directly or mounted to the motherboards through sockets. They were typically air cooled, and air flow was typically sustained by a system fan. ESD shielding was not much of a concern.

In the pursuing years, the number of transistors packed into each microprocessor, as well as its operating speed have increased dramatically, especially in recent years. Correspondingly, the amount of heat that needs to be dissipated, as well as the sensitivity to ESD during operation, have increased. As a result, most of today's microprocessor based computer systems employ either local fans and/or heat sinks to help ensure that the microprocessors run cool. At the same time, increased attentions have also been given to designing computer system chassis containing the microprocessors to ensure the ESD requirements are met.

One chassis level solution to ESD protection of electronic equipment, as disclosed in U.S. Pat. No. 6,080,930, involves providing an electrically conductive gasket on a grounded shelf of a card cage which receives movable circuit modules. As a module is slid into the card cage to engage module connectors with backplane pins of the card cage, a surface of the module contacts the gasket, thereby discharging any static electricity on the module because the gasket is grounded through connection to the shelf.

U.S. Pat. No. 6,281,433 discloses another example of chassis level ESD protection, in this case, for a network switching apparatus. A face plate of the network switching apparatus is provided with a multi-layered, coextruded structure which combines first and second polymeric material layers. An outer portion of the face plate is formed of the first polymeric material layer to protect the circuit packs within the apparatus from ESD. The first polymeric material has a composition in which an additive is suspended within a polymeric material to give the outer layer a surface resistivity to dissipate static charges that would otherwise potentially damage the network switch. The second polymeric material layer of the structure is conductive to provide electromagnetic interference (EMI) shielding.

Proposed solutions to ESD protection of circuit chips at the package level include providing a Faraday cage-type structure about the circuit chips in the package to shield them from electrostatic discharges. For example, in European Patent Application Publication No. 0 340 959, an electrically conductive gasket is employed between a heat sink and a printed wiring board carrying one or more circuit chips. The gasket electrically connects a conductive coating on the heat sink with a conductive reference plane in the printed circuit board. The conductive coating on the heat sink is provided over an electrically insulating layer applied to the heat sink. The patentees explain that the conductive layer over the insulating layer on the heat sink provides a surface separate from the heat sink for the accumulation of static charges, and thereby provides protection of chips on the board within the package from electrostatic charges.

Assignee's U.S. Pat. No. 5,838,542 discloses a processor card assembly including a heat sink attachment plate and an EMI/ESD shielding cage. A metallic plate and a back cover on respective sides of a processor disposed on a processor card, are attached to each other to form a Faraday cage for electro-magnetic shielding EMI emissions from the processor as well as providing ESD protection to the processor card. See also U.S. Pat. No. 6,307,258 wherein an ESD shielding is provided on the outside of the semiconductor die package housing.

These Faraday cage-type solutions to ESD protection at the package level can be relatively costly to manufacture and the outer insulative and conductive coatings required to be applied to the heat sinks or housings in the arrangements are subject to chipping and damage. While chassis level ESD protection has in many applications up to now been sufficient, as microprocessor manufacturers have increased microprocessor speed and shrunk the microprocessor dies in new generation microprocessors, it has been found that the conventional ESD protections in computer systems do not meet legal requirements for immunity from ESD events. For example, a European Community legal requirement for ESD protection of computers states that with a 4 kV contact and 8 kV air discharge ESD pulse at a system level, the computer must continue to work without user intervention. There is a need for an improved method and apparatus for cost effectively increasing the immunity of a semiconductor die, particularly a microprocessor, to ESD events in order to meet this legal requirement.

DETAILED DESCRIPTION

Figure 1:
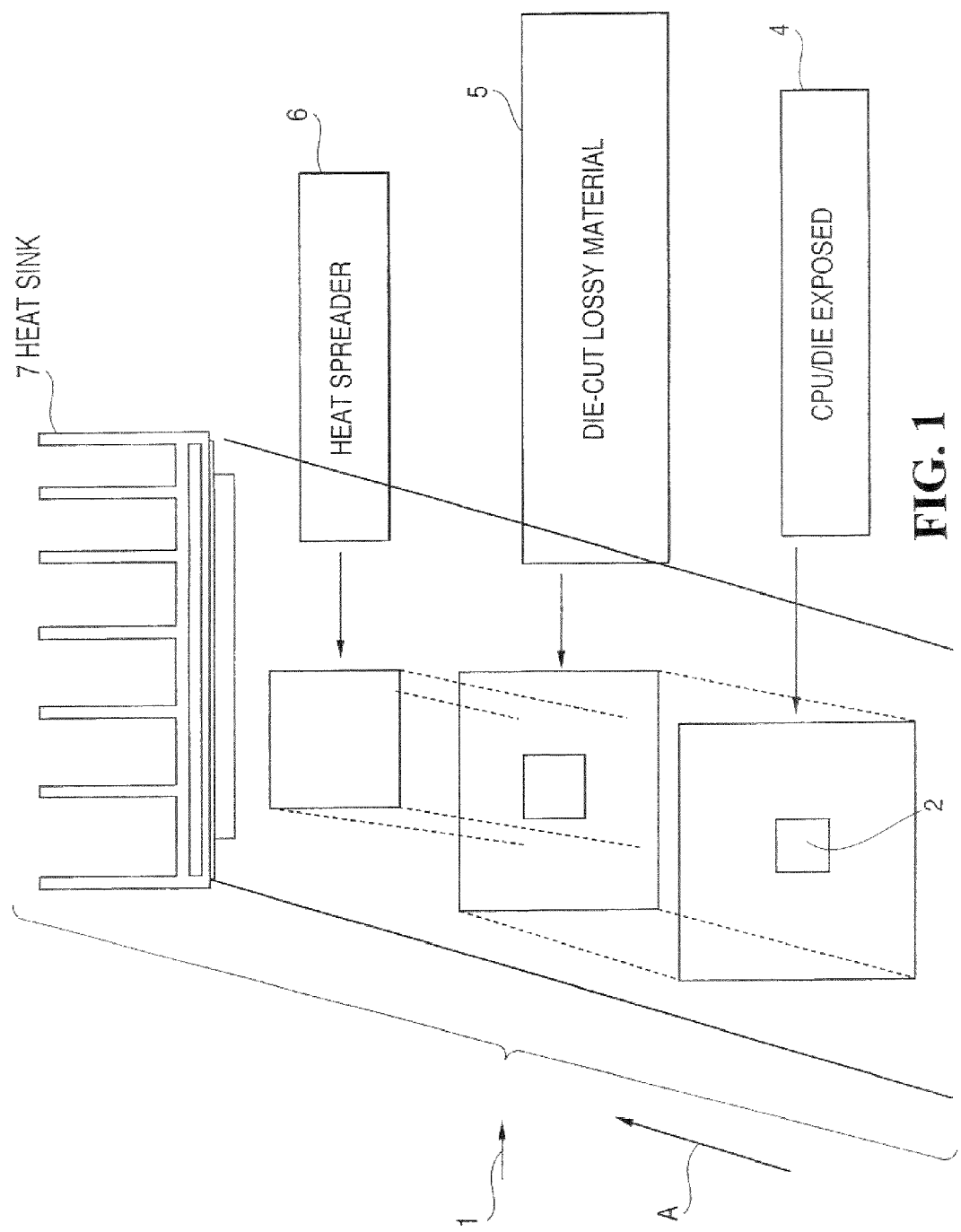
FIG. 1 is an exploded view of an apparatus, particularly a microprocessor package according to an example embodiment of the invention with the components of the package being shown disassembled in spaced relation from one another in the direction of arrow A upwardly from a substrate of the package which has a microprocessor mounted thereon.
Figure 2:
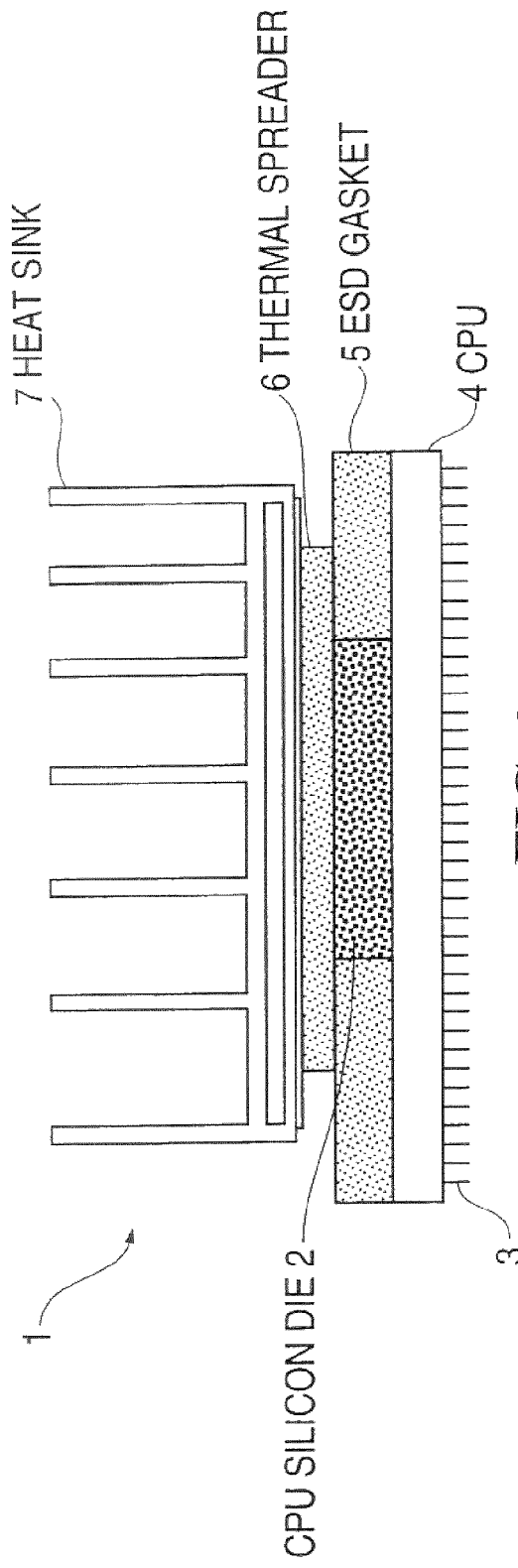
FIG. 2 is a cross-sectional view through the microprocessor package of the example embodiment of FIG. 1 taken along section line II-II and showing the components of the package in their assembled relation to one another in the package.

Referring now to the drawings, an apparatus 1 according to the example embodiment of the invention is an assembly for packaging and cooling a semiconductor die 2 with protection from electrostatic discharge events. More specifically, the apparatus in the example embodiment is an electronic package, namely a central processing unit (CPU) package, wherein the die 2 is a microprocessor. The package is adapted to be connected to a motherboard of a computer by means of pins 3 extending from a bottom, mounting side of a CPU substrate 4 of the package as depicted in FIG. 2. The microprocessor 2 is mounted on the opposite, top side of the substrate 4.

The assembly 1 further comprises a gasket 5 of a lossy, static dissipative material on the substrate 4 surrounding the die 2 to protect it from ESD pulses. A thermal spreader 6 formed of copper or other heat conductive material is arranged in heat conducting relation with the die on a side of the die opposite the substrate 4. A thermal grease or adhesive can be used to thermally couple the die and heat spreader. The thermal spreader extends laterally beyond the outer peripheral edge of the die and overhangs an adjacent edge of the gasket. A heat sink 7 is in heat conducting relation with the thermal spreader on a side of the thermal spreader opposite the die. The heat sink extends laterally beyond the outer peripheral edge of the thermal spreader. The heat sink is formed of copper in the example embodiment but other heat conductive materials could be used.

Figure 3:
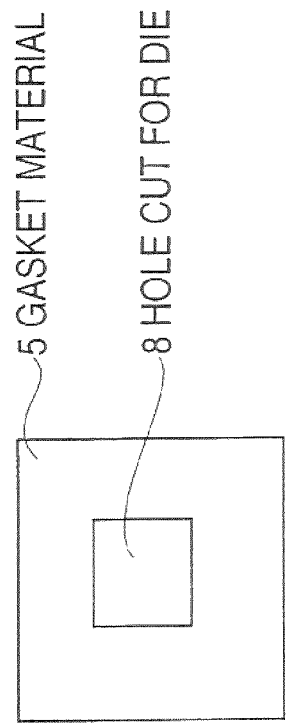
FIG. 3 is a top view of the ESD gasket employed in the example embodiment of FIGS. 1 and 2.

The gasket 5 is preferably die-cut from a sheet or layer of lossy, static dissipative material to the size of the CPU substrate 4 with a hole 8 cut for the die to protrude through. The hole is preferably the same or only slightly larger than the size of the die so the gasket closely surrounds the die in the assembly. The back or lower side of the gasket has an adhesive thereon by which the gasket is adhered to the CPU substrate in position about the die. The gasket is 0.020 inch thick, the height of the die above the substrate surface, in the example embodiment so the gasket preferably fills the space between the substrate and the heat spreader when the heat spreader is arranged in heat conducting relation with the top side of the die. As shown in FIG. 3, in the example embodiment, the hole cut in the gasket for the die is square, measuring ½ inch on each side and the outer shape of the gasket is square, measuring 1⅜ inches per side. The size, shape and thickness of the gasket can be changed as needed.

The gasket according to the invention has a shielding effectiveness to protect the die in the assembly from at least 4 kV of electrostatic discharge pulse at the computer system level in which the assembly is to be used. That is, the computer in which the CPU package 1 is used will continue to work without user intervention with a 4 kV ESD pulse at a system level. For this purpose, in the example embodiment the gasket material preferably has a greater than 45 dB shielding effectiveness up to 3 GHz in frequency which protects the package from ESD pulses. The lossy material of the gasket is a static dissipative material having a volume resistivity of greater than $10^2$ ohm cm, and preferably less than $10^9$ ohm cm.

In the example embodiment, the gasket is formed of expanded microporous polytetrafluoroethylene (ePTFE) filled with a conductive material to the extent that the gasket material has a volume resistivity of greater than $10^2$ ohm cm. The conductive filler material in the example embodiment is conductive carbon particles but other conductive, particulate fillers may be used. Such filled ePTFE materials are, per se, known.

As explained, for example, in U.S. Pat. No. 5,964,465, assigned to W.L. Gore & Associates, Inc., depending on the amount of conductive filler used to fill sheets of ePTFE, the sheets may exhibit static dissipative or conductive properties or elements produced from such sheets may be static dissipative or conductive in nature as well. The term "static dissipative" is defined as including any material with a volume resistivity of less than $10^9$ and greater than $10^2$ ohm cm as determined by ASTM D257-90. The filled ePTFE is termed "conductive" where the material has a volume resistivity of $10^2$ ohm cm or less as determined by ASTM D 257-90. The gasket of the invention is selected to be "static dissipative", not "conductive".

The lossy, static dissipative material of the gasket in the electronic package of the invention is intentionally not "conductive" as it is not desired in the first instance that the gasket serve as part of a Faraday cage-type structure in the package but rather primarily as a shield against ESD in the vicinity of the microprocessor. However, in case an ESD event occurs, the action of the static dissipative gasket material with a volume resistivity of greater than $10^2$ ohm cm is to slow ESD discharge time and decrease ESD discharge current level in comparison to a conductive gasket thereby increasing the immunity of the microprocessor from ESD events. Tests completed on a prototype microprocessor package according to the present invention showed 2000 to 3000 volt improvement in immunity to ESD failure as compared with a conventional package design. A computer with the microprocessor package of the invention meets the aforementioned Europe Community legal requirement of 4 kV of ESD pulse at a system level while continuing to work without user intervention.

From the above detailed description, it can be seen that the invention includes a method for increasing the immunity of a microprocessor from ESD events. The method comprises mounting a microprocessor on a substrate, surrounding the microprocessor with a gasket formed of lossy, static dissipative material having a volume resistivity of greater than $10^2$ ohm cm, and arranging a heat spreader in heat conducting relation with the microprocessor and atop at least a portion of the gasket. The gasket is adhesively bonded to the substrate in the example embodiment as noted above.

This concludes the description of the example embodiment. Although the present invention has been described with reference to an illustrative embodiment thereof it should be understood that numerous other modifications and embodiments can be devised by those skilled in the all that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art. For example, the invention can be used to protect a plurality of semiconductor dies on a substrate from ESD pulses by cutting a plurality of holes in the gasket for respective ones of the dies and using one or a plurality of thermal spreaders on the dies and gasket. The gasket material is not limited to filled ePTFE. Other materials having the requisite properties as disclosed herein could be employed for the gasket. The invention also has applicability to electronic packages containing semiconductor dies other than microprocessors and to electronic packages other than CPU packages. Therefore, I do not wish to be limited to the details shown and described herein, but intend to cover all such changes and modifications as are encompassed by the scope of the appended claims.

I claim:

1. A method for increasing the immunity of a microprocessor from electrostatic discharge events comprising:
   mounting a microprocessor on a substrate;
   surrounding the microprocessor with a gasket formed of lossy, static dissipative material having a volume resistivity of greater than $10^2$ ohm cm; and arranging a heat spreader in heat conducting relation with the microprocessor and atop at least a portion of the gasket.

2. The method according to claim 1, further comprising bonding the gasket to the substrate with an adhesive.

3. The method according to claim 2, wherein the adhesive is conductive.

4. The method according to claim 1, wherein the heat spreader extends beyond the outer peripheral edge of the microprocessor and overhangs an adjacent edge of the gasket.

5. The method according to claim 1, further comprising a heat sink in heat conducting relation with the heat spreader on a side of the heat spreader opposite the microprocessor.

6. The method according to claim 1, wherein the volume resistivity of the lossy, static dissipative material of the gasket is less than $10^9$ ohm cm.

7. The method according to claim 1, wherein the gasket is formed of expanded polytetrafluorethylene material filled with a conductive material to the extent that the gasket material has a volume resistivity of greater than $10^2$ ohm cm.

8. The method according to claim 1, wherein the gasket has a hole therein the size of the microprocessor through which the microprocessor protrudes.

9. The method according to claim 1, wherein the gasket has a shielding effectiveness to prevent damage to the microprocessor when at least 4 kV of electrostatic discharge pulse is applied to the assembly at a system level in which the assembly is to be used.

10. The method according to claim 1, wherein the gasket material has a shielding effectiveness of greater than 45 dB up to 3 GHz in frequency.

* * * * *